(12) United States Patent
Lewyn

(10) Patent No.: US 6,297,759 B1
(45) Date of Patent: Oct. 2, 2001

(54) DIGITAL-TO-ANALOG CONVERTER WITH HIGH-SPEED OUTPUT

(75) Inventor: Lanny L. Lewyn, Laguna Beach, CA (US)

(73) Assignee: Lewyn Consulting, Inc., Laguna Beach, CA (US)

( * ) Notice: Subject to any disclaimer, the term of this patent is extended or adjusted under 35 U.S.C. 154(b) by 0 days.

(21) Appl. No.: 09/578,980

(22) Filed: May 25, 2000

(51) Int. Cl.[7] ...................................... H03M 1/12
(52) U.S. Cl. ............................ 341/150; 341/153
(58) Field of Search ................................. 341/144, 150, 341/153, 154, 172

(56) References Cited

U.S. PATENT DOCUMENTS 4,384,277 * 5/1983 Allgood et al. .................. 341/150
5,258,761 * 11/1993 Fotouhi et al. .................. 341/172

* cited by examiner

Primary Examiner—Tuan T. Lam
(74) Attorney, Agent, or Firm—Jeffrey Slusher (57) ABSTRACT

A digital-to-analog converter (DAC) includes separate converter segments for converting the most significant bits (MSB's) and next-most-significant bits (NSB's) of a digital input word. The MSB's are converted in a thermometer-encoded capacitive DAC (CDAC), in which the MSB's are decoded and used to control the state of CDAC switches, which connect any of a plurality of CADC reference voltages, through respective unit capacitors, to the DAC output. The NSB's are converted in a preferably binary encoded resistive DAC (RDAC), in which two separate sets ("A" and "B") of RDAC switches selectively connect a plurality of RDAC reference voltages to respective A and B RDAC output buses. Control circuitry is included to decode and apply the MSB's as state control signals to the CDAC switches on each clock cycle. The NSB's are also decoded and applied as control signals, but on alternate clock cycles, to the A and B RDAC switch sets. Bus selection circuitry is included to select which of the A or B RDAC output buses is connected to the system output, via an RDAC output capacitor. The RDAC output thus alternates between the A and B RDAC switch sets, thereby ensuring that each set of switches will have time to settle before it is allowed to influence the output. Least significant bits (LSB's) (selected as a lower significance portion of the NSB's) are preferably separately converted in an LSB RDAC that has the same structure, control circuitry, and alternating control pattern, as the NSB, but with a down-scaling output capacitor. The DAC according to the invention thereby provides a high conversion rate with very low glitch disturbances.

9 Claims, 5 Drawing Sheets

DIGITAL-TO-ANALOG CONVERTER WITH HIGH-SPEED OUTPUT

BACKGROUND OF THE INVENTION

1. Field of the Invention

This invention relates to digital-to-analog converters (DAC's) and more particularly to high-speed, high-resolution, monolithic, integrated circuit (IC) digital-to-analog converters.

2. Description of the Related Art

Changes in the digital input code to a digital-to-analog converter (DAC) produce changes in the analog output that are often accompanied by output voltage spikes known as "glitches". Each such glitch represents a conversion error because the output signal does not correspond exactly to the digital input signal. It is therefore an obvious goal of DAC design to reduce the occurrence or at least the effect of such glitches. Consequently, much effort and money has been devoted to finding a solution to the problem of overcoming glitch problems in DAC's. Indeed, the need for a solution becomes more and more acute as the bandwidth and transmission rates of data in telecommunications systems rapidly increase, thus requiring even greater DAC conversion speed and resolution.

One way to reduce the peak amplitude of these output spikes is to use lowpass filtering. One problem with this known solution, however, is that the energy contributed by the spikes then generally results in output non-linearity. In binary-coded DAC's, such as the one disclosed in U.S. Pat. No. 4,366,439 (Yamakito), or in $\mu$-law, PCM-coded DAC's such as is described in U.S. Pat. No. 4,369,433 (Yamakito), significant glitches occur even with small changes in the input signal when capacitors of large value are switched out and smaller capacitors are switched in.

Early work in low-glitch DAC technology focused on the development of "glitch free" decoders. DAC's constructed using these elements employed a new type of decoder which, for a unit increase in the value of the input code (one integer), turned on or off only one weighting element at a time. This kind of decoder became commonly known as a "thermometer decoder". Such thermometer decoders were usually connected to an output network consisting of elements of equal strength or "weight". A small change in the input code would then produce a uniform change in the output current or voltage both near and far from mid-scale values.

Although the glitch energy in a DAC using a thermometer-decoder is low, one weighting element must be used for each non-zero input code. For example, a DAC with a binary full-scale input of $2^{14}$ requires over 8,000 weighting elements. In monolithic IC construction, DAC weighting networks with 256 elements are practical, but an 8,000-element array would require such a large amount of available silicon area as to be unacceptable.

The usual approach to high-resolution converter design is then to split the device's weighting elements into at least two sections, or segments. In these segmented designs, the higher strength weighting elements are driven by the most-significant bits (MSB's) in the input code, and the lower strength weighting elements are driven by the least-significant bits (LSB's). One might say that the higher strength weighting elements reside in the upper or MSB segment of the DAC, while the weaker elements reside in the lower or LSB segment.

One disadvantage of this MSB/LSB segmented design is that the "glitch-free" converter architectures found in the prior art typically reduce glitch energy only in single-segment converters—they do not guarantee glitch-free performance when applied to two or more segments of the same converter. More specifically, timing mismatches between the upper and lower segment decoders may themselves cause output glitches. For example, when the upper segment output increases by only one weighting element in response to a small code change, the lower segment may decrease by several element outputs.

The use of thermometer codes does, however, have advantages other than the production of low glitch energy. For example, because only one weighting element output at a time need typically be switched in as the digital input changes, the differential linearity of such a converter is better than that of a simple binary coded converter near mid-scale. Accordingly, the common practice is to design the converter with a thermometer-coded upper segment, but with a binary-coded lower segment. One example of this design is found in U.S. Pat. No. 4,665,380 (Lewyn). When such a converter is used for high-resolution audio disc reproduction, a sample-and-hold (S/H) circuit is typically included after the DAC analog output in order to hold the sample and hold input voltage at the end of the input sampling interval, thereby preventing the glitch present at the beginning of the next interval from passing through to the output.

An obvious drawback of including sample-and-hold circuits is that they, too, require additional circuit area and power. Furthermore, S/H circuits often introduce undesirable non-linearities, particularly when operated at high frequencies. Such non-linearities result from a variety of sources, which include amplifier slew-rate limitations when the output is transitioning from a currently held output voltage to the following one. Other high-speed sample-and-hold non-linearities arise from non-linear clock and input signal feedthrough. Still other non-linearities arise when the MOS switch resistance varies with output signal voltage and polarity.

Because DAC glitches have one-half of a clock cycle to settle out when used as a component within an analog-to-digital converter (ADC), the DAC of U.S. Pat. No. 4,665,380 (Lewyn) was suitable for use even without a sample-and-hold in an ADC. Even in such an application, however, the combination of series switches used in the MSB capacitor arrays to couple the MSB to the LSB array results in a significant amount of glitch energy, from which the system must recover within one-half clock cycle. An improvement that reduces the number of series switches in a thermometer coded DAC for use in an ADC is disclosed in U.S. Pat. No. 5,640,162 (Lewyn). However, even in this improved design, the series combination of switches used in the MSB capacitor arrays, as well as the timing mismatches between the upper- and lower-segment decoding blocks, results in glitch energy that is still too large for use in a high-resolution DAC that lacks a sample-and-hold circuit.

When it comes to a DAC that is divided into MSB and LSB segments, what is needed is therefore a topology that achieves lower glitch energy, preferably with even higher resolution, than is possible using existing designs. This invention provides such a topology.

SUMMARY OF THE INVENTION

The invention provides a digital-to-analog converter (DAC) that converts a digital input word into a corresponding analog output signal. The DAC according to the invention includes a capacitive digital-to-analog converter (CDAC) voltage reference source, which provides a plurality of CDAC reference voltages, and a CDAC segment, which includes a plurality of CDAC switches. Each CDAC switch has a plurality of CDAC switch states, in each of which the respective CDAC switch connects a respective one of the reference voltages, through a respective CDAC unit output capacitor, to a DAC output.

The DAC according to the invention also includes at least one resistive converter (RDAC) segment that includes an RDAC voltage reference source, which comprises an equally spaced resistive divider that provides a plurality of RDAC reference voltages, and first and second RDAC output buses. The RDAC segment also includes a first and a second plurality of RDAC switches. Each RDAC switch has a conductive state, in which it connects a respective one of the RDAC reference voltages to the first and second DAC output buses, respectively, and a non-conductive state, in which it isolates the respective RDAC reference voltage from the first and second RDAC output buses.

A bus selector arrangement is also included and has a first state, in which the first RDAC output bus is connected, via an RDAC output capacitor, to the DAC output, and a second state, in which the second RDAC output bus is connected, via the RDAC output capacitor, to the DAC output.

The invention also provides a switch control arrangement that has, as its input, a digital input word. The digital input word has a plurality of most significant bits (MSB's) and a plurality of remaining bits that include at least one next-most-significant-bit. The switch control arrangement includes a master clock signal that has a predetermined clock cycle; a CDAC switch control portion that includes an MSB decoder that converts the MSB's to corresponding CDAC state control signals according to a predetermined MSB conversion function, the CDAC state control signals being applied, via a CDAC control bus, to the CDAC switches, each state control signal thereby switching each CDAC switch to a corresponding one of the plurality of CDAC switch states; and an RDAC switch control portion including an RDAC decoder arrangement that converts the next-most-significant bits to corresponding RDAC state control signals according to a predetermined remaining bit conversion function. The RDAC state control signals are applied on alternate clock cycles via first and second RDAC control buses, to the first and second plurality of RDAC switches, respectively. Each RDAC state control signal thereby sets each of the first and second pluralities of RDAC switches to a corresponding one of its RDAC switch states.

A bus selection circuit is also included to generate bus selection control signals that are applied to the bus selector arrangement for switching it between the first and second states on alternate clock cycles and in synchronism with the application of the RDAC state control signals.

The RDAC switch is preferably a single-polarity CMOS semiconductor device. In particular, each RDAC switch is preferably an N-type CMOS switch.

In the preferred embodiment of the invention, the CDAC voltage reference source has five CDAC reference voltages, including a minimum CDAC reference voltage (Vmin), a maximum CDAC reference voltage (Vmax) and three intermediate CDAC reference voltages and corresponding CDAC voltage taps, the CDAC reference voltages differing from each other by a constant voltage increment $\Delta V$. The CDAC voltage reference source preferably comprises a series of resistances, at least one of which is capacitively bypassed to system ground. The RDAC voltage reference source is preferably a portion of the CDAC voltage reference source corresponding to the voltage levels extending from Vmin to V1=Vmin+$\Delta V$, where the voltage V1 is the maximum reference voltage of the RDAC.

In applications of the invention in which the digital input word is such that the digital input word includes a plurality k of next most significant bits (NSB's) and a plurality of least significant bits (LSB's), separate ones of the resistive converter segments are provided for conversion of the NSB's and LSB's, respectively. Each resistive converter segment then includes respective first and second pluralities of the RDAC switches and first and second output buses. A separate bus selector arrangement is then included for each resistive converter segment, each bus selector arrangement synchronously switching between the first and second states on alternate clock cycles. Where the number of switches in each of the first and second pluralities of the RDAC switches, and the number of reference voltages, in the resistive converter segment provided for conversion of the NSB's, is equal to 2 k, the RDAC output capacitor of the resistive converter segment provided for the NSB's preferably has unit capacitance C, and the RDAC output capacitor of the resistive converter segment provided for the LSB's has capacitance equal to (½ k)*C.

DETAILED DESCRIPTION

This invention converts a digital input word into analog form. As is usual, the digital input word is assumed to include a plurality of most significant bits (MSB's) and remaining bits (at least one), which have lesser binary significance. It is common to refer to these remaining bits as the least significant bits (LSB's). In the preferred embodiment of the invention, however, the digital input word is partitioned into three parts of decreasing significance: the MSB's, a plurality of next most significant bits (NSB's), and a plurality of least significant bits (LSB's). The preferred embodiment of the invention has separate processing blocks for each of these different pluralities of bits. As is made clearer below, however, this partitioning scheme is not necessary, but will rather depend on the actual bit length of the input word, and on various design criteria, which are also explained below. In some cases, it may be sufficient to have only two types of bits and corresponding processing blocks: MSB's and LSB's, whereby the LSB's are converted as the NSB's in the preferred embodiment. In other cases, the digital input word may be so large, that is, include so many bits, that additional processing blocks will preferably be included. The terms "remaining bits" or "less significant bits" therefore designate collectively all bits other than the MSB's.

Figure 1:
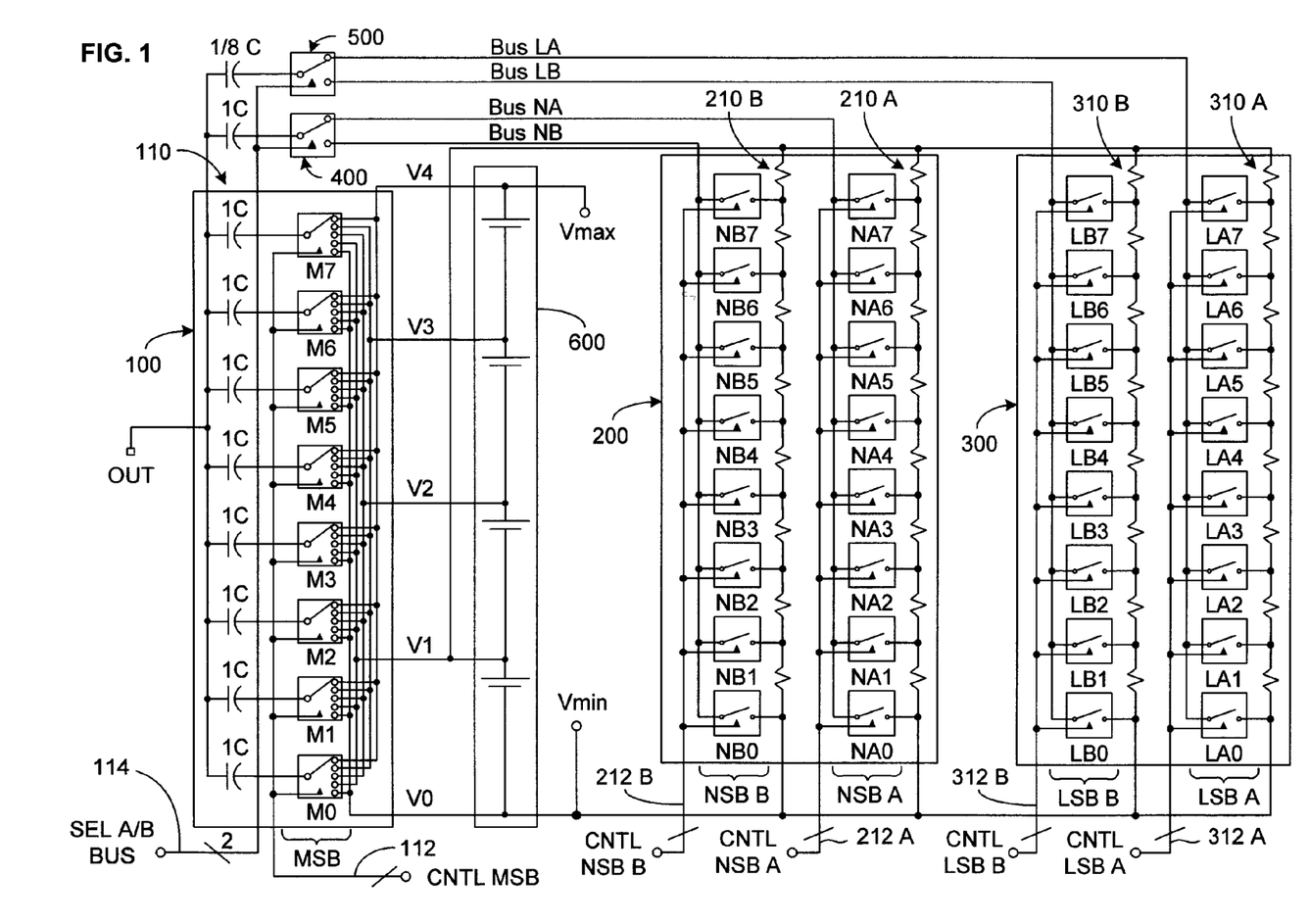
FIG. 1 is a block diagram that illustrates the segmented switching arrangement used in the preferred embodiment of the invention.

The main circuits used in the digital-to-analog converter (DAC) according to the invention are a switching or output arrangement and a control or input arrangement. FIG. 1 illustrates the switching or output arrangement.

The switching arrangement according to the invention has two main segments: a capacitive DAC (CDAC) switching segment 100 that is controlled by and converts the most significant bits (MSB's) of a digital input word into analog form, and a resistive DAC (RDAC) switching segment that is controlled by and converts the remaining bits of the digital input word into analog form. In the preferred embodiment of the invention, in which the digital input word is partitioned into MSB's, NSB's and LSB's, the RDAC segment is in turn divided into two RDAC switching blocks 200 (for NSB's) and 300 (for LSB's) that are controlled by and convert, respectively, the next most significant bits (NSB's) and the least significant bits (LSB's) of the digital input word.

The preferred embodiment of the invention also includes an NSB bus selection circuit ("selector") 400, and an LSB bus selection circuit ("selector") 500. The structure, function, and cooperation of the various main components 100, 200, 300, 400, and 500 of the preferred switching/output arrangement are described in greater detail below.

The concepts MSB's and LSB's are well understood in the art of digital design. as is the partitioning of a digital word into the categories of most and least bit significance. The term NSB's has been used here to describe the bits of next most significance below the MSB's, in other words, bits with value intermediate between MSB's and LSB's.

This invention can be used to quickly and smoothly (with low glitch) convert digital input words of any length. Indeed, it is particularly beneficial when converting high-resolution (large) input data, and in these cases, partitioning the digital input word into three portions—MSB, NSB and LSB—will help increase the invention's conversion speed and smoothness.

On the other hand, the invention does not require large input words, and in some implementations, it will possible to convert all non-MSB bits of the input words using a single RDAC switching block, thereby treating all non-MSB bits as NSB's. Conventional design methods may be used to determine what level of partitioning of input words is best, and which bits are to be treated as MSB's, NSB's, and LSB's. Merely by way of example, the description of the invention below assumes 11-bit input words, with a partitioning of MSB: five bits; NSB: three bits; and LSB: three bits.

A precision multiple voltage reference 600 is also included in the switching arrangement according to the invention. In FIG. 1, the voltage reference 600 is illustrated as a series of identical voltage sources (batteries) connected between a maximum voltage Vmax and a minimum voltage Vmin, which are supplied by any conventional external voltage source (not shown). In the preferred embodiment of the invention, the voltage sources are implemented using a single resistive divider with voltage taps for V1, V2, and V3. As is well known, for such taps V1, V2 and V3 to behave as voltage sources, the taps must be bypassed to ground through capacitors of roughly 0.1 $\mu$F, or greater, in value.

The voltage reference in this example provides five different, equally spaced voltage levels V0, V1, . . . , V4. Voltage levels V0 and V4 are simply the two supply voltage levels Vmin and Vmax, respectively.

In actual implementations of the invention, the voltage reference 600 will be a continuous resistive strip from which intermediate taps are led, each tap establishing a different reference voltage level; this is well known. In order to provide low impedance voltage steps (from V0 to V1, from V1 to V2, and so on), however, the voltage divider taps that provide the successive reference voltages V1, V2, V3, and V4 should be capacitively bypassed to system ground. The bypass capacitors (not shown, merely for the sake of simplicity) may be constructed using normal techniques with values such as 0.1 $\mu$F or larger.

The voltage levels Vmax and Vmin can be chosen using normal design methods and will depend on what maximum and minimum amplitude levels are desired for the DAC-converted output signal. In most applications of the invention, the digital input signal will represent one or more sinusoidal components and will, as such represent both positive and negative amplitudes. In such cases, Vmax and Vmin will typically correspond to predetermined voltage levels +Vref and −Vref, respectively. Other reference levels may of course be chosen without in any way affecting the operation or structure of the invention—only the range of the analog output signal OUT would change. One other possible choice would set V0=Vmin=0. This is assumed here because it makes it easier to understand the operation of the switching arrangements used in the invention. Thus, assuming by way of example that V0=Vmin=0:

V0=0; V1=0.25*Vmax; V2=0.5*Vmax; V3=0.75*Vmax; V4=Vmax

The simplified CDAC segment 100 illustrated in FIG. 1 includes a bank of eight unit capacitors 110, which are connected in parallel between the system output OUT and different the voltage reference taps V0, V1, . . . , V4 via eight respective MSB switches M0, M1, . . . , M7. The actual capacitance of the unit capacitors will be determined using conventional design methods. In one prototype of the invention, each unit capacitor had a value of 0.1 pF. Although eight capacitors are shown in the exemplifying CDAC shown in FIG. 1, the number of capacitors may be far greater without changing the basic switch arrangement. In one prototype of the invention, for example, 64 capacitors with unit value 0.1 pF are employed. As is described below, the CDAC segment 100 operates as a "thermometer encoder", whose design is known. The number of capacitors, voltage taps, and switches can thus be chosen using known techniques for thermometer-encoded DAC design.

The MSB switches M0, . . . , M7 operate functionally as single-pole, n-throw switches, where n is the number of different reference voltage levels, here, five. The unit capacitor between the output and each respective MSB switch can thus be connected to any of the n reference voltage levels. As is explained below in greater detail, the settings of the MSB switches are controlled by the MSB's of the digital input word, in particular, control signals CNTL MSB, via an MSB control bus 112. Each unit capacitor in the capacitor bank 110 can be connected to any of the n reference voltage levels. Of course, the switches M0–M7 are not mechanical (considering that the invention may be used to provide conversion rates on the order of tens of Megahertz); rather, in practice, the MSB switches will be implemented using CMOS technology, as is shown below.

The RDAC switching block 200 includes two functionally and structurally identical switching sections NSB A and NSB B. Each section, in turn, includes a bank of NSB switches NB0, . . . , NB7 and NA0, . . . , NA7, respectively. Each NSB switch operates as a single-pole, single throw switch connecting a tap of a resistive voltage divider 210A, 210B to a respective NSB output bus (single analog line) Bus_NA, Bus_NB. The states of the switches are set by the NSB's of the digital input word. In this example, there are three NSB's, and thus $2^3=8$ NSB switches in each section. As with the MSB switches, however, the NSB switches are implemented as semi-conductor devices, as is illustrated and described below.

The maximum voltage of each resistive voltage divider 210A, 210B is taken from the first incremental tapped voltage (next-to-lowest reference voltage) V1 of the voltage reference 600; the minimum voltage is then the minimum reference voltage V0. If there are m NSB's, then there will be $2^m$ NSB switches in each section, and $2^m$ equally spaced, tapped voltage reference levels. Recall that, here, V0 is assumed for the sake of simplicity to be equal to 0V. The switches NA0, NB0 connect V0 to their respective output buses Bus_NA, Bus_NB and each higher switch in the switching block connects the output bus to the next higher tap of the respective resistive divider 210A, 210B. Thus, the following voltages are connected to the output bus Bus_NA by the various switches NA0–NA7:

NA0: V0(=0)

NA1: $V0+\frac{1}{8}*V1=V0+\frac{1}{8}*(\frac{1}{4}*Vmax)=V0+\frac{1}{32}*Vmax=\frac{1}{32}*Vmax$ NA2: $V0+\frac{2}{8}*(\frac{1}{4}*Vmax)=\frac{2}{32}*Vmax=\frac{1}{16}*Vmax$ NA3: $\frac{3}{32}*Vmax$ NA4: $\frac{4}{32}*Vmax$ NA5: $\frac{5}{32}*Vmax$ NA6: $\frac{6}{32}*Vmax$ NA7: $\frac{7}{32}*Vmax$ Thus, the NSB switching blocks 210A, 210B further divide the minimum MSB increment of $\frac{1}{4}*Vmax$ into eight smaller levels. Each NSB switch has only two states: conductive or non-conductive, which are controlled by respective NSB control buses CNTL NSB A and CNTL NSB A.

In the preferred embodiment of the invention, the RDAC switching block 300 is preferably structurally identical to the NSB switching block, the only significant differences being that it converts and is controlled by the LSB's of the digital input word, rather than the NSB's, and the outputs of its respective LSB A and LSB B sections are connected to output buses Bus_LA and Bus_LB, respectively, rather than to the buses Bus_NA and Bus_NB. Thus, LSB switches LA0–LA7 correspond to NSB switches NA0–NA7; switches LB0–LB7 correspond to NSB switches NB0–NB7 ; and the resistive dividers 310A, 310B correspond to the resistive dividers 210A, 210B.

Note, however, that it is not necessary for there to be the same number of LSB's (and thus LSB switches) as there are NSB's (and NSB switches), although this simplifies the selection of reference voltage levels for the respective switching blocks. As FIG. 1 shows, the voltages at either end of the LSB resistive dividers 310A, 310B are the same as for the NSB resistive dividers 210A, 210B, that is, V1 ($=\frac{1}{4}*Vmax$) and V0. By definition, however, the LSB's have lower significance than the NSB's, so that their contribution to the analog output should be less. As is explained below, this is accomplished in the illustrated, preferred embodiment of the invention by subsequent scaling down of the output (on the buses Bus_LA and Bus_LB) of the LSB switching block by a factor of eight using a DAC capacitor that is $\frac{1}{8}$ of the unit capacitor value.

In general, if k is the number of NSB bits that the NSB switching block 200 converts, then $2^k$ will be the number of switches in each of the "A" and "B" sections NSB_A, NSB_B, and also the number of different voltage levels provided by the resistive divider 210A, 210B. The scaling capacitor of the LSB-converting block 300 should then be chosen to have a capacitance of $\frac{1}{2^k}$ times the unit capacitance.

The NSB and LSB switching blocks 200, 300 preferably use binary encoding, such that only one respective voltage tap contributes to the analog output at any one time. Thus, the maximum voltage applied by the NSB switching block 200 will be $\frac{7}{32}*Vmax$, applied through NA7 or NB7; the maximum voltage applied by the LSB switching block 300, applied through LA7 or LB7, will also be $\frac{7}{32}*Vmax$, but it will result in $\frac{1}{8}$ the charge input produced by block 200 because it will be applied through a $\frac{1}{8}$ unit capacitor. The maximum charge resulting from block 200 maximum output voltage is then the same as if it were a voltage of $\frac{7}{256}*Vmax$ that was subsequently applied through a unit (not $\frac{1}{8}$ unit) size capacitor.

In FIG. 1, the resistive dividers in the next-significant-bit (NSB) block 200 and the least-significant bit (LSB) block 300 are shown as being connected to separate pairs of resistive dividers 210A, 210B and 310A, 310B. If all resistors shown are of equal value, however, then the resulting voltage taps produce a succession of outputs equally spaced in voltage. Consequently, the eight successively increasing voltages provided by the resistive divider pairs 210A/210B and 310A/310B may be provided by respective single resistor strings (or tapped, continuous resistive strips) containing eight resistors (or tap positions) each.

In fact, in an actual prototype of the invention, the voltage source 600, which was implemented as a resistive strip having major tap points to provide the reference voltages V1–V3 (each major tap point voltage being capacitively bypassed to signal ground), also served to provide the minor tap points required to implement all of the voltages provided by the illustrated resistive dividers 210A, 210B, 310A, 310B. This was done by providing equally spaced minor voltage taps in the lowest portion (between the V0 point and the major V1 tap) as the minor voltage reference taps for the RDAC resistive dividers. In other words, the lowest $\frac{1}{4}$ of the voltage source 600 was further subdivided, with more closely spaced minor taps, to provide the more closely spaced reference voltages required by blocks 200 and 300. The various resistive dividers are shown as separate battery/resistor networks in FIG. 1 merely for greater clarity and ease of illustration.

An NSB bus selector 400 is provided for the pair of analog output buses (Bus_NA, Bus_NB) that carry the output voltage signals from the respective sections (NSB A or NSB B) of the NSB switching block 200. Similarly, an LSB bus selector 500 is provided for the pair of analog output buses (Bus_LA, Bus_LB) that carry the output voltage signals from the respective sections (LSB A or LSB B) of the LSB switching block 300. These bus selectors, which are implemented as semiconductor switches (see below) operate as single-pole, dual-throw switches. Under the control of bus selection signals Sel_A_Bus and Sel_B_Bus (collectively, Sel_A/B_Bus), which are applied via a bus 114, they thereby connect the outputs of either the "A" buses (Bus_NA and Bus_LA) or the "B" buses (Bus_NB and Bus_LB) to the output OUT via either a unit capacitor (for the NSB buses Bus_NA and Bus_NB) or via a capacitor having one-eighth unit capacitance (for the LSB buses Bus_LA and Bus_LB). In other words, depending on the Sel_A/B_Bus control signals, either the "A" buses or the "B" buses are allowed to contribute to the analog output signal OUT, with the other buses being blocked, that is, disconnected, from the output. As will become clearer from the discussion below, by changing the states of the switches within the selectors 400, 500, the outputs of the "A" and "B" buses are sampled on alternate clock cycles.

Each of the CDAC switches M0–M7 can assume one of five states S0, S1, S2, S3, and S4, corresponding to connection of the reference voltage levels V0, V1, V2, V3, and V4, respectively, to the output OUT, via the associated unit capacitor. Using this notation, Table 1 is a logic table that shows the state of each CDAC switch for each of the 32 (in this example) possible states of the MSB's of the digital input word. Assume that the MSB portion of the digital input word has the structure:

MSB=(m4, m3, m2, m1, m0), where bit mi corresponds to $2^i$.

TABLE 1

| MSB Input Data | | | | | CDAC Switch Positions | | | | | | | |
|---|---|---|---|---|---|---|---|---|---|---|---|---|
| $2^4$ | $2^3$ | $2^2$ | $2^1$ | $2^0$ | (CNTL MSB) | | | | | | | |
| m4 | m3 | m2 | m1 | m0 | M0 | M1 | M2 | M3 | M4 | M5 | M6 | M7 |
| 0 | 0 | 0 | 0 | 0 | S0 | S0 | S0 | S0 | S0 | S0 | S0 | S0 |
| 0 | 0 | 0 | 0 | 1 | S1 | S0 | S0 | S0 | S0 | S0 | S0 | S0 |
| 0 | 0 | 0 | 1 | 0 | S2 | S0 | S0 | S0 | S0 | S0 | S0 | S0 |
| 0 | 0 | 0 | 1 | 1 | S3 | S0 | S0 | S0 | S0 | S0 | S0 | S0 |
| 0 | 0 | 1 | 0 | 0 | S4 | S0 | S0 | S0 | S0 | S0 | S0 | S0 |
| 0 | 0 | 1 | 0 | 1 | S4 | S1 | S0 | S0 | S0 | S0 | S0 | S0 |
| 0 | 0 | 1 | 1 | 0 | S4 | S2 | S0 | S0 | S0 | S0 | S0 | S0 |
| 0 | 0 | 1 | 1 | 1 | S4 | S3 | S0 | S0 | S0 | S0 | S0 | S0 |
| 0 | 1 | 0 | 0 | 0 | S4 | S4 | S0 | S0 | S0 | S0 | S0 | S0 |
| 0 | 1 | 0 | 0 | 1 | S4 | S4 | S1 | S0 | S0 | S0 | S0 | S0 |
| 0 | 1 | 0 | 1 | 0 | S4 | S4 | S2 | S0 | S0 | S0 | S0 | S0 |
| 0 | 1 | 0 | 1 | 1 | S4 | S4 | S3 | S0 | S0 | S0 | S0 | S0 |
| 0 | 1 | 1 | 0 | 0 | S4 | S4 | S4 | S0 | S0 | S0 | S0 | S0 |
| 0 | 1 | 1 | 0 | 1 | S4 | S4 | S4 | S1 | S0 | S0 | S0 | S0 |
| 0 | 1 | 1 | 1 | 0 | S4 | S4 | S4 | S2 | S0 | S0 | S0 | S0 |
| 0 | 1 | 1 | 1 | 1 | S4 | S4 | S4 | S3 | S0 | S0 | S0 | S0 |
| 1 | 0 | 0 | 0 | 0 | S4 | S4 | S4 | S4 | S0 | S0 | S0 | S0 |
| 1 | 0 | 0 | 0 | 1 | S4 | S4 | S4 | S4 | S1 | S0 | S0 | S0 |
| 1 | 0 | 0 | 1 | 0 | S4 | S4 | S4 | S4 | S2 | S0 | S0 | S0 |
| 1 | 0 | 0 | 1 | 1 | S4 | S4 | S4 | S4 | 53 | S0 | S0 | S0 |
| 1 | 0 | 1 | 0 | 0 | S4 | S4 | S4 | S4 | S4 | S0 | S0 | S0 |
| 1 | 0 | 1 | 0 | 1 | S4 | S4 | S4 | S4 | S4 | S1 | S0 | S0 |
| 1 | 0 | 1 | 1 | 0 | S4 | S4 | S4 | S4 | S4 | S2 | S0 | S0 |
| 1 | 0 | 1 | 1 | 1 | S4 | S4 | S4 | S4 | S4 | S3 | S0 | S0 |
| 1 | 1 | 0 | 0 | 0 | S4 | S4 | S4 | S4 | S4 | S4 | S0 | S0 |
| 1 | 1 | 0 | 0 | 1 | S4 | S4 | S4 | S4 | S4 | S4 | S1 | S0 |
| 1 | 1 | 0 | 1 | 0 | S4 | S4 | S4 | S4 | S4 | S4 | S2 | S0 |
| 1 | 1 | 0 | 1 | 1 | S4 | S4 | S4 | S4 | S4 | S4 | S3 | S0 |
| 1 | 1 | 1 | 0 | 0 | S4 | S4 | S4 | S4 | S4 | S4 | S4 | S0 |
| 1 | 1 | 1 | 0 | 1 | S4 | S4 | S4 | S4 | S4 | S4 | S4 | S1 |
| 1 | 1 | 1 | 1 | 0 | S4 | S4 | S4 | S4 | S4 | S4 | S4 | S2 |
| 1 | 1 | 1 | 1 | 1 | S4 | S4 | S4 | S4 | S4 | S4 | S4 | S3 |

In response to a progressively increasing digital input code, a particular one of the capacitors 110, namely, the one connected to M0, is therefore switched from the minimum reference voltage V0 through successive reference voltages V1, V2, V3, and finally the full reference voltage V4=Vmax. For additional progressive increases in MSB code value, this "M0" capacitor will remain connected to the full reference voltage V4, and the next higher capacitor (connected to M1) is similarly progressively connected to the increasing reference voltages until it, too, is connected to the maximum reference voltage V4, at which point the next higher switch (M2) in the CDAC segment is progressively switched, and so on. Of course, as the digital input code decreases, this connection pattern is reversed.

Note that, in this preferred encoding, the upper three MSB bits (m4,m3,m2) designate which switch is currently changing states, with lower numbered switches all being in state S4, that is, passing the maximum voltage through to the respective unit capacitor. The lower two MSB bits (m1,m0) indicate which state (voltage reference level) the switch is in. Let the symbol "#" indicate a number expressed in base 2. If the MSB's of the digital input word were to be #11010, then this would be interpreted as switch #110 (M6) being in state S2 (connected to V2), with switches M0–M5 all being in states S4.

This example also serves to explain how one would adapt the CDAC section to even larger digital input words. In order to convert eight MSB's instead of the illustrated five, for example, the upper six MSB bits would designate which switch is currently "active", in the sense that it's state is the one that will be changed for an incremental change in the MSB. The remaining two, lower MSB bits would still indicate which state the corresponding switch is in, that is, which of the four voltages levels below V4 it is to pass. Converting eight MSB's thus requires $2^6$ switches, but still only four voltage levels other than the maximum voltage V4.

It would be possible to provide a different number of reference voltage levels than five. As is explained in greater detail below, however, having five equally spaced reference voltages (that is, four other than the "null" reference V0) is preferred even when a larger number of MSB's is to be converted: Five levels suffice to uniquely encode all the possible MSB combinations in practical applications of the invention while still keeping the silicon area and complexity of each MSB switch within the ranges typically preferred for CMOS fabrication.

Note that for changes in input code causing even more than one CDAC switch to operate, only those switches change position that are necessary to change from one value to the next. In addition, no single increasing code change causes any capacitor input voltages to be switched from high to low reference voltages while others are being switched from low to high reference voltages. While one switch will most likely switch from an intermediate voltage to full-scale voltage, only one additional switch will switch from zero voltage to some intermediate voltage within the CDAC. This general result in a DAC is known as "glitchless switching." Even for more rapid changes in the MSB's of the input code, the minimum state changes are required in the CDAC switches. This is, of course, the whole point of a DAC configured with "thermometer encoding" and as such is well known, and reduces the effect of glitches in the conversion of the MSB's.

Each of the RDAC switches in the NSB and LSB blocks 200, 300 can assume either of two states: a state of "0" or "open," in which the switch is non-conductive, and a state of "1" or "closed," in which the switch is conductive. Tables 2 and 3 are logic tables that show, the states of the NSB and LSB switches, for every possible state of the NSB's and LSB's, respectively, of the digital input word. The order of the switch closures as shown in Tables 2 and 3 is commonly known as conventional binary decoding.

TABLE 2

| NSB Input Data | | | NSB Switch Positions (CNTL NSB A/B) | | | | | | | |
|---|---|---|---|---|---|---|---|---|---|---|
| $2^2$ | $2^1$ | $2^0$ | NB0 | NB1 | NB2 | NB3 | NB4 | NB5 | NB6 | NB7 |
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

TABLE 3

| LSB Input Data | | | LSB Switch Positions (CNTL LSB A/B) | | | | | | | |
|---|---|---|---|---|---|---|---|---|---|---|
| $2^2$ | $2^1$ | $2^0$ | LB0 | LB1 | LB2 | LB3 | LB4 | LB5 | LB6 | LB7 |
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

As is explained above, in the invention, there are two sets of switches in the NSB RDAC 200 (NA0–NA7 and NB0–NB7 ). The control signals for each set—CNTL_NSB_A and CNTL_NSB_B, which are applied via buses 212A and 212B, respectively, are updated in accordance With the NSB digital data on alternate clock cycles. Each of the two sets of switches is always connected to its respective output bus Bus_NA and Bus_NB.

In most applications of the invention, digital data will be input to the DAC on each clock cycle. According to the invention, the digital data driving each set of switch control signals (CNTL_NSB_A and CNTL_NSB_B) is then held for two clock cycles. This means that each NSB RDAC bus analog output (on Bus_NA and Bus_NB) changes value only when updated at the beginning of the first of the two clock cycles, then remains relatively constant in value throughout the second of the two clock cycles as the control signals remain stable. This means in turn that, on each clock cycle, one of the NSB RDAC output buses will have a stable, constant output value, since it will have already been held for at least one clock cycle; the output signal on the other bus will, however, have been set on that clock cycle and begun to change value. That signal will of course then be held into the next clock cycle, during which time it will have stabilized. The NSB bus selector 400 is driven by clock signals to select (pass) the relatively constant one of the two Bus_NA or Bus_NB signals. These signals are then connected to the DAC output OUT through the unit capacitor, which has the same size as the bank of capacitors 110 in the CDAC.

As is described above, because the maximum voltage from the NSB RDAC block 200 is V1=0.25*Vmax, the NSB RDAC provides 8 voltage levels between 0 and 0.25*Vmax, which fill in the voltage steps V0=0, V1=0.25*Vmax, V2=0.5*Vmax, V3=0.75*Vmax, and V4=Vmax that are provided by the MSB switches M0–M7 in the CDAC block 100. As is explained further below, because the maximum voltage available for the RDAC blocks 200, 300 is only 0.75*Vmax, the switches in these blocks may be constructed using only NMOS devices. This property increases the switching speed and reduces the glitch effect as compared with switching devices that require both polarities.

The LSB bus selector 500 operates in the same manner as the LSB bus selector 400 described above: There are two sets of switches in the LSB RDAC 300 (LA0–LA7 and LB0–LB7). The control signals for each set—CNTL_LSB_A and CNTL_LSB_B, which are applied via buses 312A and 312B, respectively, are updated in accordance with the LSB digital data on alternate clock cycles and together with the corresponding switching section ("A" or "B") of the NSB block 200. Each of the two sets of switches is always connected to its respective output bus Bus_LA and Bus_LB.

As with the control of the NSB switching block 200, according to the invention, the digital data driving each set of switch control signals (CNTL_LSB_A and CNTL_LSB_B) is held for two clock cycles. This means that each LSB RDAC bus analog output (on Bus_LA and Bus_LB) changes value only when updated at the beginning of the first of the two clock cycles, then remains relatively constant in value throughout the second of the two clock cycles as the control signals remain stable. This means in turn that, on each clock cycle, one of the LSB RDAC output buses will have a stable, constant output value, since it will have already been held for at least one clock cycle; the output signal on the other bus will, however, have been set on that clock cycle and begun to change value. That signal is then be held into the next clock cycle, during which time it will have stabilized. The LSB bus selector 500 is driven by clock signals to select (pass), on alternate clock cycles, the relatively constant one of the two Bus_LA or Bus_LB signals. These signals are then connected to the DAC output OUT through the one-eighth unit capacitor ⅛C.

Because the maximum voltage from the LSB RDAC block 300 is ¼*Vmax, and the capacitor size is only ⅛C, the eight LSB RDAC voltage levels between V0=0 and V1=¼*Vmax fill in the output steps between those provided by the NSB switches in the NSB RDAC 200. As before, because the maximum voltage available for the LSB RDAC 300 is only ¼*Vmax, these switches may also be constructed using only NMOS devices.

Note that the DAC output signal OUT is the charge produced by the various capacitors (the CDAC unit capacitors 110 and the capacitors connecting the NSB and LSB analog buses to the output). This charge will then be converted using conventional circuitry (not shown) into whatever form (preferably voltage) that is needed by the following components that, in any given application of the invention, require a voltage proportional to the DAC the analog charge output at the OUT terminal.

Figure 2:
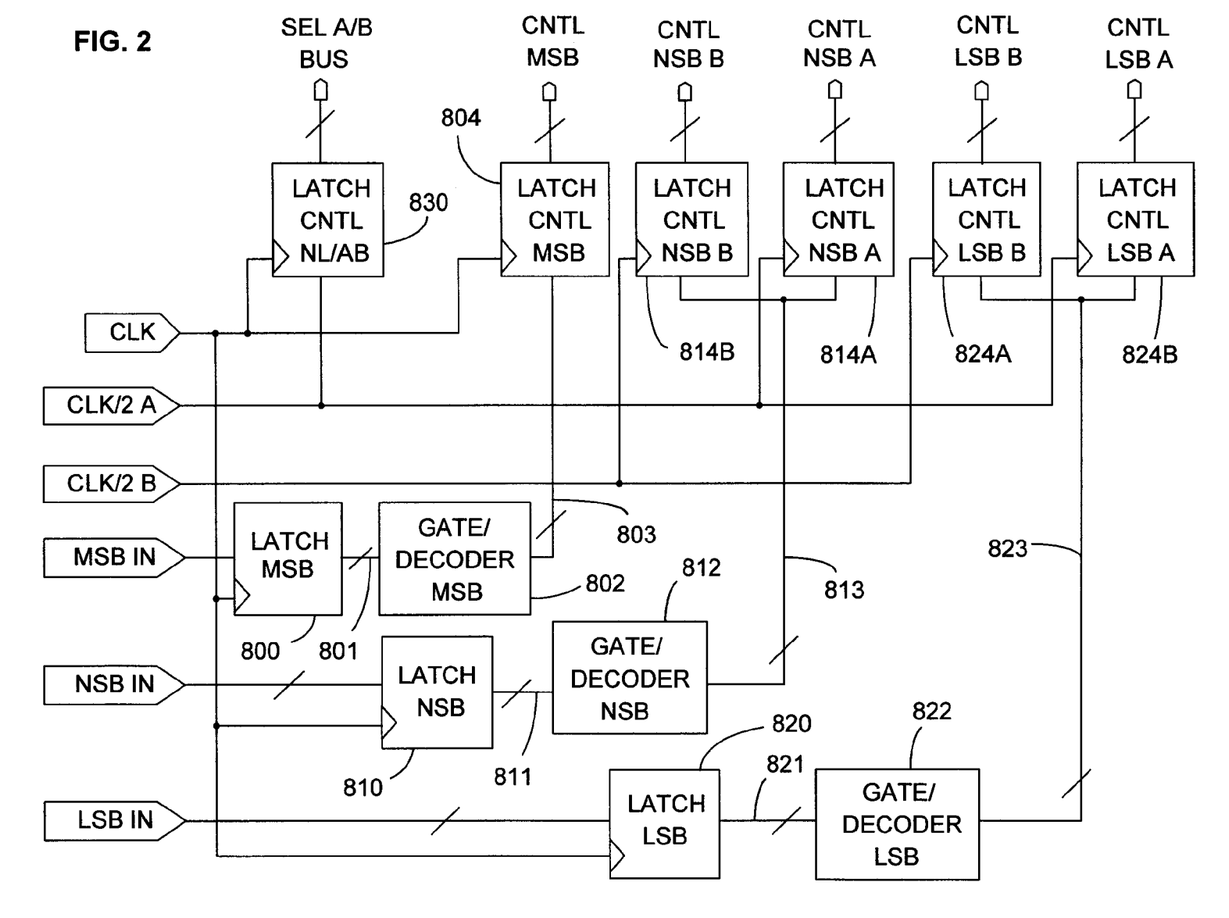
FIG. 2 is a block diagram of the timing and control circuitry used to control the states of the various switches in the switching arrangement of FIG. 1.

A simplified block diagram of the control circuitry required to operate the DAC is shown in FIG. 2. The digital input word, which is generated by any known preceding device, system or component, is applied to the DAC as MSB's, NSB's and LSB's (which may be done simply by routing the respective conductors), which are first latched in respective latches 800, 810, 820. The latched MSB's, NSB's, and LSB's are then applied, via buses 801, 811, 821, respectively, as inputs to conventional gates/decoders 802, 812, 822, which convert the MSB's, NSB's, and LSB's into corresponding encoded control signals MSB_Code, NSB_Code, and LSB_Code in accordance with Table 1, 2, and 3, respectively. These Code signals are, of course, the same as the respective control signals CNTL_MSB, CNTL_NSB A/B and CNTL_LSB A/B, but, as is shown below, the control signals will typically lag the Code signals because they are re-timed by the appropriate clock signals CLK, CLK/2 A, and CLK/2 B.

The encoded (according to Table 1) MSB control signals MSB_Code are then applied, via a bus 803, and latched in a latch 804. The NSB code signals NSB_Code (which become CNTL_NSB_A and CNTL_NSB_B) are applied, via a bus 813, and are latched on alternate clock cycles into either latch 814A or 814B, depending on whether they are to control NSB switching section A or B (NA0–NA7 or NB0–NB7). Similarly, the LSB code signals LSB_Code (which become CNTL_LSB_A and CNTL_LSB_B) are applied, via a bus 823 and latched on alternate clock cycles into either latch 824A or 824B, depending on whether they are to control LSB switching section A or B (LA0–LA7 or LB0–LB7). Whereas the MSB control signals are updated and latched into latch 804 on every clock cycle, the latches 814A and 824A on the one hand, and 814B and 824B on the other hand, receive and latch updated values alternately, on every other clock cycle. Thus, when latches 814A and 824A are clocked to receive new control signals, latches 814B and 824B are not clocked, and vice versa.

In FIG. 2, triangular symbols at the bottom left of each latch indicate the respective latch's clock input. By way of example, it is assumed that data is latched on the rising edges of the respective clock signals. Of course, it is well known in the art of digital design to latch on falling edges instead. The clocking operation of a digital latch is well known.

The invention operates with three different clock signals, all of which can be, and preferably are, derived in a known manner from a master clock signal CLK. As is illustrated below, two other clock signals—CLK/2_A and CLK/2_B are used besides CLK. These half-clock signals CLK/2_A and CLK/2_B are simply clock signals with twice the period of CLK. CLK/2_A is preferably the logical inverse of CLK/2_B, which, in practical implementations, means they have a constant phase difference of 180 degrees.

In operation, the bus selectors 400, 500 (see FIG. 1) act as switches that toggle back and forth between their two respective input signals, changing input bus on each clock cycle. The control circuitry thus includes a latch 830 that generates the Sel_A_Bus and Sel_B_Bus control signals. These control signals also have twice the period of the master clock, are the inverse of each other, and preferably arrive slightly before and are also the inverse of the signals CLK/2_A and CLK/2_B that drive the latching of the data into the A and B sections of the NSB and LSB blocks 200, 300. In other words, the Sel_A_Bus signal is preferably the inverse of the CLK/2_A signal, and the Sel_B_Bus is preferably the inverse of the CLK/2_B signal. This ensures that new data will not be in the process of being latched into section A switches NA0–NA7 and LA0–LA7 when the output of these switches is being passed to the DAC output OUT; this in turn gives the respective switching sections NSB_A and LSB_A time to develop stable outputs before these output are applied to form part of the system output OUT. Of course, the same analysis applies to the Sel_B_Bus and CLK/2_B signals to ensure that the output from switching sections NSB_B and LSB_B are used only when they have had at least one clock cycle to stabilize.

To ensure low glitch performance, it is important that the latches 804 and 830 are driven by the same master clock signal CLK. Provided that these latches are constructed from identical circuitry, which can be accomplished using known methods, then the control outputs on buses 112, 114 will change state at approximately the same time. This alignment between control bus signals helps minimize DAC output glitch. It should be noted that the timing on buses 212A, 212B, 312A, and 312B need not be precise within a few nanoseconds, because the NSB and LSB RDAC outputs are re-sampled by switch blocks 400 and 500 that are precisely controlled in time.

Figure 3:
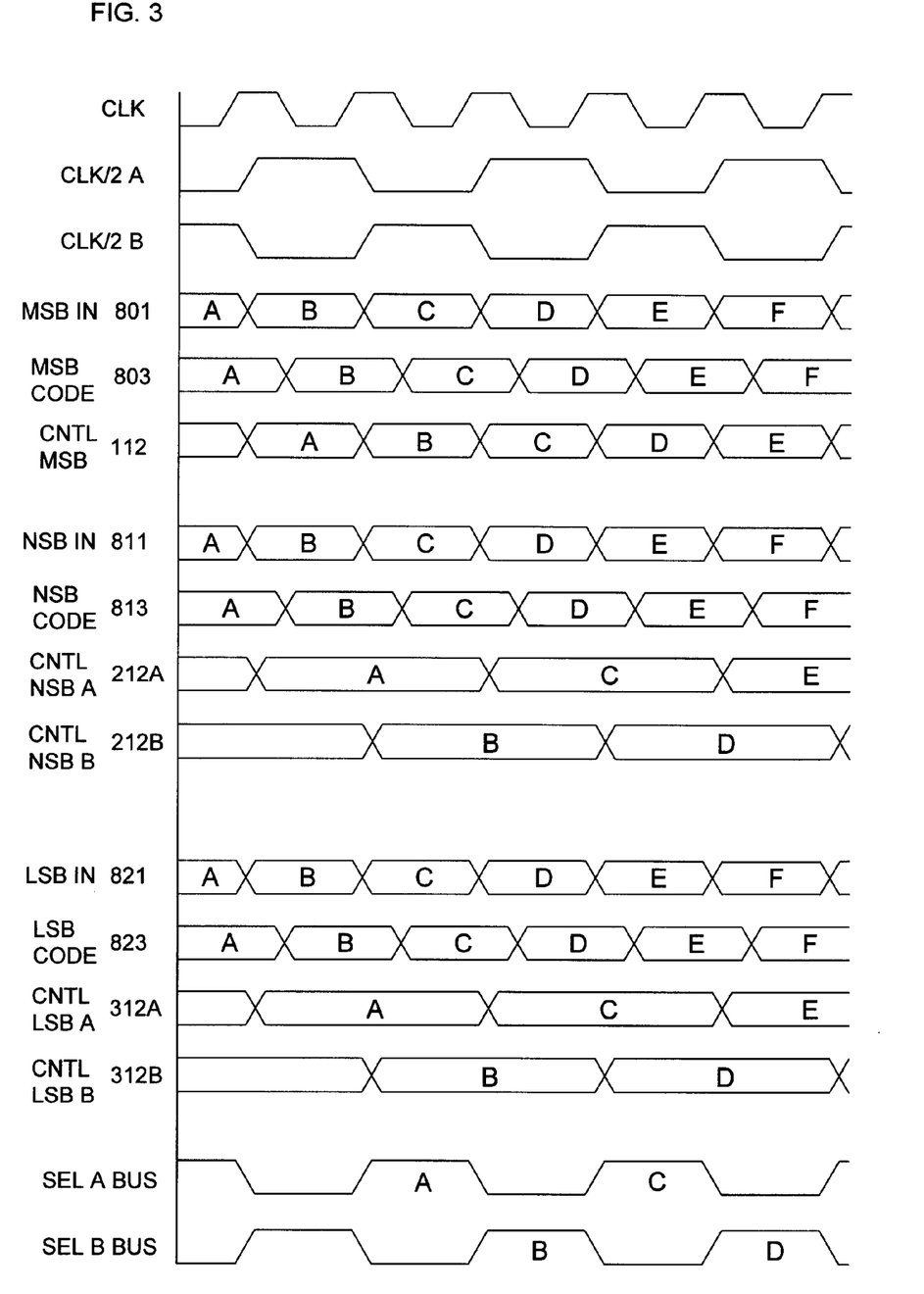
FIG. 3 is an example of a timing diagram showing the states of various data, clock, and switch-control signals used in the invention.

FIG. 3 is a representative timing diagram of various signals in the control circuit shown in FIG. 2. It can be seen that the ODAG control signals CNTL_MSB on bus 112 and the bus selector 400 and 500 control signals Sel_A_Bus, Sel_B_Bus, on 114 are preferably all aligned precisely in time. A shot time delay, on the order of few nanoseconds, is permitted and even desired from the leading edge or these 112 and 114 bus signals and the NSB/LSB control signals on control buses 212A, 212B, 312A, 312B. This short time delay ensures that the appropriate switch in block 400 and 500 disconnects just before the analog input data to that switch changes as a result of the control code change. This short time delay is ensured by deriving the clocking signals CLK/2_A and CLK/2_B derived from, and therefore slightly delayed relative to, the master clock signal CLK; generation of CLK/2_A and CLK/2_B from CLK can be done using conventional circuitry and methods.

Figure 4:
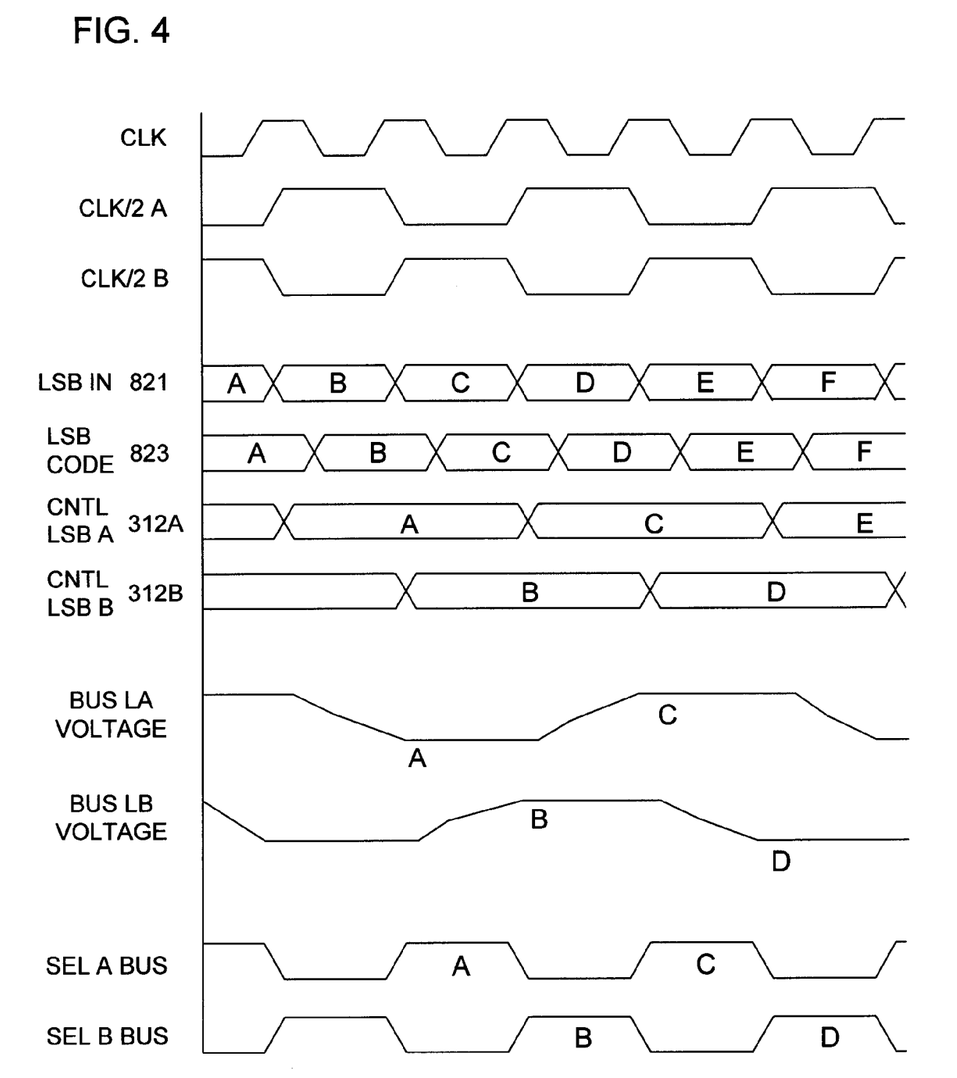
FIG. 4 is a diagram that illustrates the timing of state changes in the control signals and output signals for one RDAC segment.

FIG. 4 is a representative timing diagram showing the control of the bus selectors 400, 500, and the effect of the alternative switching in of the signals from the bus pairs Bus_NA/Bus_LA and Bus_NB/Bus_LB. Notice in particular that the bus selectors switch only when the signal to which they are switching have had time to reach a stable, constant value. This of course greatly reduces the likelihood and possible impact of glitch energy affecting the DAC output OUT.

Figure 5A:
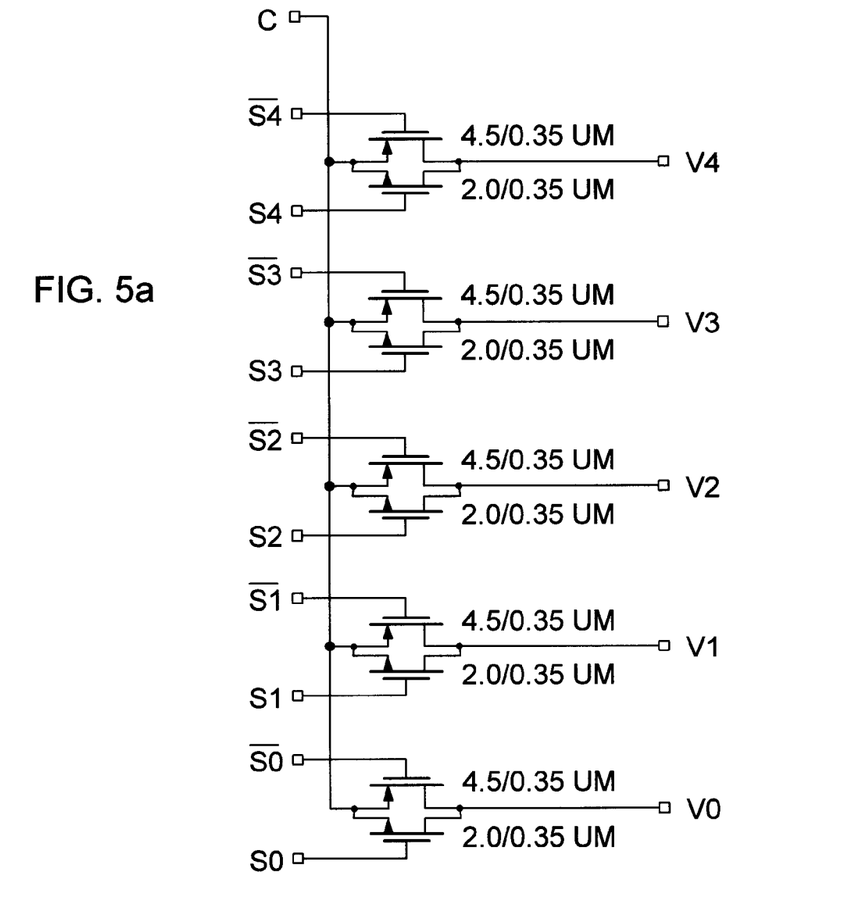
FIGS. 5a, 5b, and 5c show, respectively, preferred implementations of a CDAC switch, an RDAC switch, and a segment bus selector used in the segmented switching arrangement according to the invention.

FIG. 5a is a circuit diagram of an implementation of one of the MSB switches M0–M7 according to the preferred embodiment of the invention. (All of these switches are of course preferably designed identically.) As can be seen in the figure, the drains of a PMOS/NMOS transistor (switch) pair are connected, with a conductor from each voltage tap V0–V4 being connected to the drains of the associated pair. The sources of all the transistor pairs are also connected and form a common output line, labeled C, which is then connected to the associated unit capacitor (see FIG. 1).

Five control lines (one for each possible state) are provided for each switch. In FIG. 5a, these are labeled S0–S4, and are applied to the gates of the NMOS transistors in each pair. Lines carrying the logical inverses of S0–S4 are applied and are applied to the gates of the NMOS transistors in each pair as connected. For reference voltage level V0–V4, the gate of the corresponding NMOS transistor (switch) in the pair is connected to the corresponding state control signal as shown in Table 1; the gate of the PMOS transistor (switch) in the pair is connected to the logical inverse of the control signal. For example, if the switch is to pass the voltage V3, then S3 is set to 1 ("HIGH") and the remaining signals S0, S1, S2, and S4 are set to "0" ("LOW").

It is common practice in the design of analog CMOS switches to balance the conductance of the NMOS switch near the negative end of the analog input signal range with the conductance of the PMOS switch near the positive end of the analog signal range. For this reason, the width/length (W/L) ratios of the NMOS and PMOS switches in the CDAC are preferably not equal, but are ratioed using known design methods to assure approximately equal conductance.

Another aspect of analog switch, or analog transmission gate, design is to attempt to balance the combined conductance of the parallel combination of NMOS and PMOS switches over the entire range of analog input signals. The switch sizing is a best-effort compromise to achieve all of the above desired characteristics The switch W/L dimensions (1.5 and 4.5) shown are for a typical 0.35 $\mu$M CMOS process. For this embodiment of the invention the switch control signal voltages are +/−1.5V, the analog signal input range is +/−1.25V, and the substrate voltages for NMOS and PMOS are −2.5V and +2.5V respectively.

Figure 5B:
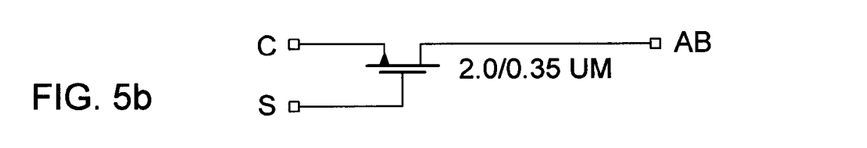

The preferred structure of the RDAC NSB or LSB switches (NA0–NA7, NB0–NB7, LA0–LA7, LB0–LB7) in accordance with the present invention is shown in FIG. 5b: The drain of each switch is connected to the respective voltage tap (labeled AB), the source is connected to the output (labeled C, which will also be the respective one of the analog output buses Bus_NA/LA, Bus_NB/LB), and the gate is controlled by a binary state signal S, formed in accordance with Tables 2 or 3 and applied via the buses 212A, 212B, 312A, 312B. Note that the NSB and LSB switches in blocks 200 and 300 need be constructed using only NMOS transistors because the maximum analog input signal range is only ¼*Vmax. This is an important improvement because restricting the analog input voltage range for these switches allows them to be constructed from high-conductance NMOS switches, without requiring PMOS switches, which result in much higher capacitance for a negligible contribution to conductance in the signal voltage range of 0 to 0.25*Vmax.

Figure 5C:
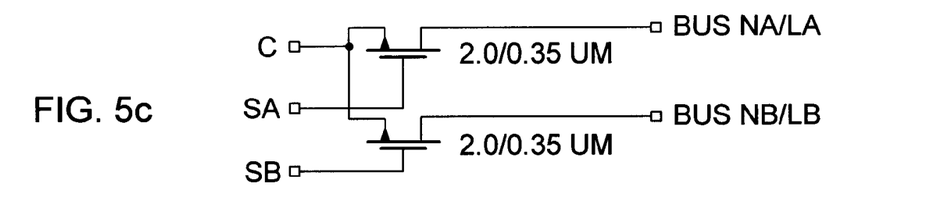

FIG. 5c shows the preferred structure of the bus selector circuits 400, 500: For each circuit 400, 500, the respective analog buses Bus_NA/LA and Bus_NB/LB are connected to the drains of matching NMOS transistor switches, whose gates are controlled by the bus selection signals SA and SB on bus 114 (see FIG. 1). The output of the switch, which is applied to either the unit capacitor or the ⅛C capacitor, is taken from the switch sources, which are connected. SA and SB are the logical inverse of each other, so that the A bus signal is passed when SA=1 and the B bus signal is passed when SB=1.

The NMOS switch size in blocks 200 and 300 as shown in FIG. 5b are designed to match the NMOS switch size in bus selector circuits 400 and 500, which are shown in FIG. 5c. The reason for this is to meet the design goal of ensuring that the response time constant of the series combination of switches in blocks 200 and 400 is at least approximately equal to that of the series combination of switches in blocks 300 and 500 and at least approximately equal to that of the parallel combination of switches M0–M7 in CDAC block 100. Making the time response of all switches approximately equal is important in reducing DAC glitch energy because if the time constants of each successive signal transition from the DAC are approximately equal, then very minimal glitch results from unequal rise or fall times. Note again that one property of the converter according to the invention is that for increases or decreases in the input digital code, all voltages applied to the weighting network capacitors from all blocks produce a useful signal output—either all increase or decrease—at approximately the same time and with approximately the same time constant.

As is known in the art of integrated circuit design, PMOS switches become slower and less efficient as their source voltage goes in the negative direction because their gate-source voltage becomes too small. It is also well known that because the surface mobility of holes is about ⅓ the mobility of electrons, PMOS devices, having the same W/L ratio as NMOS devices and the same gate drive, have approximately the same capacitance, but only ⅓ of the conductance.

NMOS devices, on the other hand, lose speed and efficiency at source voltages that are too high and too close to their gate voltage. Note that, in most cases, both positive and negative voltages +Vref and −Vref will be provided, so that:

V0=Vmin=−Vref

V1=V0+ΔV

V2=V0+2*ΔV

V3=V0+3*ΔV

V4=V0+4*ΔV=+Vref where ΔV=¼*[+Vref−(−Vref)] or simply ¼*Vmax if Vmin is assumed to be 0.

It is therefore advantageous to select the number of MSB switches in the CDAC, and the number of reference voltage levels, so that the NSB block 200 need cover, that is, have a maximum output voltage only the lower fourth (V0–V1) of the CDAC supply voltage. This allows the use of purely NMOS switches in the non-MSB blocks 200, 300, which provides lower switch resistance while avoiding the parasitic capacitance of a slower PMOS device. The combined PMOS/NMOS switches used in the CDAC (MSB) block, 100, however, then handle the upper three-fourths of the reference voltage range, in which the parallel switch combination is efficient, because the CDAC does not require two switch devices in series, with the PMOS device being required to ensure uniformity of switch resistance over the whole supply range, including the middle voltage range.

Including only four non-maximum reference voltage levels also promotes the use of only NMOS switches in the non-MSB segments 200, 300: If, for example, only two such reference voltages were included, then the complexity of each MSB switch would decrease, but the maximum supply voltage over the RDAC segments would increase and possibly preclude the use of NMOS-only switches, because the NMOS conductance would degrade significantly when the source voltage approached mid-supply. On the other hand, increasing the number of non-maximum reference voltage levels to, say, eight instead of four would require twice the control line pitch for the PMOS/NMOS CDAC switches, with a corresponding increase in the required fabrication area.

As is mentioned above, it is not strictly necessary to include separate NSB and LSB blocks 200, 300. Rather, one could envision simply increasing the NSB block 200 to include all of the switches needed to convert both the NSB's and the LSB's. For small digital input words, this may be acceptable. In most cases, however, dividing the remaining, non-MSB portion of the input word into NSB's and LSB's both increases speed and greatly reduces the number of switches required.

To illustrate this, consider FIG. 1 again. Using the illustrated NSB/LSB implementation, a total of 32 switches are all that is needed not only to encode the six remaining bits (three NSB's and three LSB's), but also to include the alternation between the outputs of the "A" switches (NSB_A and LSB_A) and the "B" switches (NSB_B and LSB_B). Assume instead that one implemented only the single NSB block 200 to handle the encoding of ail six remaining bits. Not only would such an implementation require 2*2$^6$=128 switches, but the block would be much slower because of the greatly increased capacitance of so many extra switches. It will therefore be most silicon-area efficient to split the non-MSBs into an approximately equal number of LSB's and NSB's.

It would also be possible to add bits of even lesser significance than the LSBs described in the preferred embodiment. To add such bits, it would not generally be required to practice the principles taught in the present invention. Because these bits would produce such a small change in output charge, there will usually be no need to wait until the switches in such a low-significance segment stabilize before allowing their voltage contribution to influence the DAC output. These bits could be converted by using a single DAC that did not alternate between an "A" and "B" switch section. Care should be taken, however, using normal design methods and components, to assure that the switching of such an added single-segment would occur at the same time as the MSB switch control lines changed state.

On the other hand, the principles of this invention could easily be extended by those skilled in the art of DAC design to provide additional "A" and "B" switch section for accommodating bits of lesser significance. Such an additional switching block could then use the same reference voltage taps used by the LSB RDAC, with a ¹⁄₆₄ unit scaling capacitor, or by using smaller voltage reference taps from the reference voltage divider resistor, or by using some combination of both.

I claim:

1. A digital-to-analog converter (DAC) for converting a digital input word into a corresponding analog output signal comprising:

a capacitive digital-to-analog converter (CDAC) voltage reference source having a plurality of CDAC reference voltages;

a CDAC segment including a plurality of CDAC switches, each CDAC switch having a plurality of CDAC switch states, in each of which CDAC switch states the respective CDAC switch connects a respective one of the reference voltages, through a respective CDAC unit output capacitor, to a DAC output;

at least one resistive converter (RDAC) segment that includes:

an RDAC voltage reference source comprising an equally spaced resistive divider providing a plurality of RDAC reference voltages;

a first RDAC output bus;

a second RDAC output bus;

a first plurality of RDAC switches, each having a conductive state, in which it connects a respective one of the RDAC reference voltages to the first RDAC output bus, and a non-conductive state, in which it isolates the respective RDAC reference voltage from the first RDAC output bus;

a second plurality of RDAC switches, each having a conductive state, in which it connects a respective one of the RDAC reference voltages to the second RDAC output bus, and a non-conductive state, in which it isolates the respective RDAC reference voltage from the first RDAC output bus;

a bus selector arrangement having a first state, in which the first RDAC output bus is connected, via an RDAC output capacitor, to the DAC output, and a second state, in which the second RDAC output bus is connected, via the RDAC output capacitor, to the DAC output;

a switch control arrangement having, as its input, a digital input word that includes a plurality of most significant bits (MSB's) and a plurality of remaining bits that include at least one next-most-significant-bit;

the switch control arrangement including:

a master clock signal having a predetermined clock cycle;

a CDAC switch control portion including an MSB decoder converting the MSB's to corresponding CDAC state control signals according to a predetermined MSB conversion function, the CDAC state control signals being applied, via a CDAC control bus, to the CDAC switches, each state control signal thereby switching each CDAC switch to a corresponding one of the plurality of CDAC switch states;

an RDAC switch control portion including an RDAC decoder arrangement converting the next-most-significant bits to corresponding RDAC state control signals according to a predetermined remaining bit conversion function, the RDAC state control signals being applied on alternate clock cycles:

via a first RDAC control bus, to the first plurality of RDAC switches, each RDAC state control signal thereby setting each of the first plurality of RDAC switches to a corresponding one of its RDAC switch states; and via a second RDAC control bus, to the second plurality of RDAC switches, each RDAC state control signal thereby setting each of the second plurality of RDAC switches to a corresponding one of its RDAC switch states; and a bus selection circuit generating bus selection control signals that are applied to the bus selector arrangement for switching the bus selector arrangement between the first and second states on alternate clock cycles and in synchronism with the application of the RDAC state control signals.

2. A DAC as defined in claim 1, in which each RDAC switch is a single-polarity CMOS semiconductor device.

3. A DAC as defined in claim 2, in which each RDAC switch is an N-type CMOS switch.

4. A DAC as defined in claim 1, in which the CDAC voltage reference source has five CDAC reference voltages, including a minimum CDAC reference voltage (Vmin), a maximum CDAC reference voltage (Vmax) and three intermediate CDAC reference voltages and corresponding CDAC voltage taps, the CDAC reference voltages differing from each other by a constant voltage increment $\Delta V$.

5. A DAC as defined in claim 4, in which the CDAC voltage reference source comprises a series of resistances, at least one of which is capacitively bypassed to system ground.

6. A DAC as defined in claim 5, in which:

the RDAC voltage reference source is a portion of the CDAC voltage reference source corresponding to the voltage levels extending from Vmin to V1=Vmin+$\Delta V$; and the voltage V1 is the maximum reference voltage of the RDAC.

7. A DAC as defined in claim 1, in which:

the remaining bits of the digital input word include a plurality k of next most significant bits (NSB's) and a plurality of least significant bits (LSB's);

separate ones of the resistive converter segments are provided for conversion of the NSB's and LSB's, respectively;

each resistive converter segment includes respective first and second pluralities of the RDAC switches and first and second output buses;

the number of switches in each of the first and second pluralities of the RDAC switches, and the number of reference voltages, in the resistive converter segment provided for conversion of the NSB's, is equal to $2^k$; and a separate bus selector arrangement is included for each resistive converter segment, each bus selector arrangement synchronously switching between the first and second states on alternate clock cycles.

8. A DAC as defined in claim 7, in which:

the RDAC output capacitor of the resistive converter segment provided for the NSB's has unit capacitance C; and the RDAC output capacitor of the resistive converter segment provided for the LSB's has capacitance equal to $(\frac{1}{2}^k)*C$.

9. A digital-to-analog converter (DAC) for converting a digital input word into a corresponding analog output signal, comprising:

a capacitive digital-to-analog converter (CDAC) voltage reference source having a plurality of CDAC reference voltages;

a CDAC segment including a plurality of CDAC switches, each CDAC switch having a plurality of CDAC switch states, in each of which CDAC switch states the respective CDAC switch connects a respective one of the reference voltages, through a respective CDAC unit output capacitor, to a DAC output;

at least one resistive converter (RDAC) segment that includes:
  an RDAC voltage reference source comprising an equally spaced resistive divider providing a plurality of RDAC reference voltages;
  a first RDAC output bus;
  a second RDAC output bus;
  a first plurality of RDAC switches, each having a conductive state, in which it connects a respective one of the RDAC reference voltages to the first RDAC output bus, and a non-conductive state, in which it isolates the respective RDAC reference voltage from the first RDAC output bus;
  a second plurality of RDAC switches, each having a conductive state, in which it connects a respective one of the RDAC reference voltages to the second RDAC output bus, and a non-conductive state, in which it isolates the respective RDAC reference voltage from the first RDAC output bus;

a bus selector arrangement having a first state, in which the first RDAC output bus is connected, via an RDAC output capacitor, to the DAC output, and a second state, in which the second RDAC output bus is connected, via the RDAC output capacitor, to the DAC output;

a switch control arrangement having, as its input, a digital input word that includes a plurality of most significant bits (MSB's) and a plurality of remaining bits that include at least one next-most-significant-bit;
  the switch control arrangement including:
    a master clock signal having a predetermined clock cycle;
    a CDAC switch control portion including an MSB decoder converting the MSB's to corresponding CDAC state control signals according to a predetermined MSB conversion function, the CDAC state control signals being applied, via a CDAC control bus, to the CDAC switches, each state control signal thereby switching each CDAC switch to a corresponding one of the plurality of CDAC switch states;
    an RDAC switch control portion including an RDAC decoder arrangement converting the next-most-significant bits to corresponding RDAC state control signals according to a predetermined remaining bit conversion function, the RDAC state control signals being applied on alternate clock cycles:
      via a first RDAC control bus, to the first plurality of RDAC switches, each RDAC state control signal thereby setting each of the first plurality of RDAC switches to a corresponding one of its RDAC switch states; and
      via a second RDAC control bus, to the second plurality of RDAC switches, each RDAC state control signal thereby setting each of the second plurality of RDAC switches to a corresponding one of its RDAC switch states; and a bus selection circuit generating bus selection control signals that are applied to the bus selector arrangement for switching the bus selector arrangement between the first and second states on alternate clock cycles and in synchronism with the application of the RDAC state control signals;

in which:

each RDAC switch is a single-polarity, N-type, CMOS semiconductor switch;

the CDAC voltage reference source has five CDAC reference voltages, including a minimum CDAC reference voltage (Vmin), a maximum CDAC reference voltage (Vmax) and three intermediate CDAC reference voltages and corresponding CDAC voltage taps, the CDAC reference voltages differing from each other by a constant voltage increment $\Delta V$;

the RDAC voltage reference source is a portion of the CDAC voltage reference source corresponding to the voltage levels extending from Vmin to V1=Vmin+$\Delta V$; and the voltage V1 is the maximum reference voltage of the RDAC;

the remaining bits of the digital input word include a plurality k of next most significant bits (NSB's) and a plurality of least significant bits (LSB's);

separate ones of the resistive converter segments are provided for conversion of the NSB's and LSB's, respectively;

each resistive converter segment includes respective first and second pluralities of the RDAC switches and first and second output buses;

the number of switches in each of the first and second pluralities of the RDAC switches, and the number of reference voltages, in the resistive converter segment provided for conversion of the NSB's, is equal to $2_k$; and a separate bus selector arrangement is included for each resistive converter segment, each bus selector arrangement synchronously switching between the first and second states on alternate clock cycles.

* * * * *